United States Patent
Scott et al.

(10) Patent No.: US 8,542,021 B2
(45) Date of Patent: Sep. 24, 2013

(54) MULTI-POLE ARCING FAULT CIRCUIT BREAKER INCLUDING A NEUTRAL CURRENT SENSOR

(75) Inventors: Gary W. Scott, Mount Vernon, IA (US); Paul A. Reid, Cedar Rapids, IA (US)

(73) Assignee: Schneider Electric USA, Inc., Palatine, IL (US)

( * ) Notice: Subject to any disclaimer, the term of this patent is extended or adjusted under 35 U.S.C. 154(b) by 505 days.

(21) Appl. No.: 12/947,001

(22) Filed: Nov. 16, 2010

(65) Prior Publication Data

US 2012/0119751 A1 May 17, 2012

(51) Int. Cl.
*G01R 31/14* (2006.01)
*G01R 31/08* (2006.01)
*H01H 9/50* (2006.01)
*G01R 31/02* (2006.01)
*H02H 1/00* (2006.01)

(52) U.S. Cl.
CPC ............ *G01R 31/025* (2013.01); *H02H 1/0015* (2013.01)
USPC .......................................... 324/509; 324/536

(58) Field of Classification Search
None
See application file for complete search history.

(56) References Cited

U.S. PATENT DOCUMENTS

| | | | |
|---|---|---|---|
| 3,944,888 A * | 3/1976 | Clark | 361/46 |
| 6,014,297 A * | 1/2000 | Clarey et al. | 361/42 |
| 6,246,556 B1 | 6/2001 | Haun et al. | |
| 6,259,996 B1 | 7/2001 | Haun et al. | |
| 6,621,669 B1 | 9/2003 | Haun et al. | |
| 6,987,389 B1 * | 1/2006 | Macbeth et al. | 324/536 |
| 7,079,365 B2 | 7/2006 | Brown et al. | |
| 7,149,066 B2 * | 12/2006 | Elms et al. | 361/47 |
| 7,193,827 B2 | 3/2007 | Reid et al. | |
| 7,345,860 B2 | 3/2008 | Wong | |
| 7,944,654 B2 * | 5/2011 | Scott et al. | 361/47 |
| 2010/0118451 A1 | 5/2010 | Scott et al. | |

OTHER PUBLICATIONS

Eaton: Fire-Guard® Arc Fault Circuit Interrupter (AFCI), Advance Residnetial Products Arc Fault Circuit Interrupter (AFCI), Dated Oct. 2008; 7 Pages.

(Continued)

*Primary Examiner* — Paresh Patel
(74) *Attorney, Agent, or Firm* — Nixon Peabody LLP

(57) ABSTRACT

A fault detection system is provided for a power distribution system having at least first and second line conductors carrying AC currents that are out of phase with each other from a source to a load, and a common neutral conductor. The system includes an arcing fault current sensor comprising a coil wound on a hollow core and coupled to both of the line conductors in a manner that the electrical currents in the line conductors flow in opposite directions inside the hollow core, thus inducing in the coil an output signal that is a function of the difference of the electrical currents in the line conductors. A neutral current sensor produces an output signal representing the magnitude and phase direction of current in the neutral conductor. An arcing fault detection circuit includes a processor programmed to (1) respond to a change in the first output signal to analyze the second output signal to determine whether the change in the first output signal is attributable at least in part to current in a line-to-line circuit, (2) if the answer is affirmative, determine a scaling factor to be used to adjust the value of the first output signal, and (3) analyze the adjusted first output signal to determine whether an arcing fault has occurred and produce a trip signal in response to the detection of an arcing fault.

19 Claims, 3 Drawing Sheets

(56) References Cited

OTHER PUBLICATIONS

Keith Malmedal & P.K.Sen: Arcing Fault Current and the Criteria for Setting Ground Fault Relays in Solidly-Grounded Low Voltage System, Dated Prior to Nov. 2010; 7 Pages.

Square D: Data Bulletin—The Truth About AFCIs Class 760, Dated Jun. 2002; 10 Pages.
Underwriters Laboratories Inc.: Arc Fault Testing Arc Fault Scenarios, Dated Jan. 28, 2002; 5 Pages.

* cited by examiner

MULTI-POLE ARCING FAULT CIRCUIT BREAKER INCLUDING A NEUTRAL CURRENT SENSOR

FIELD OF THE INVENTION

The present invention relates to multiple-pole circuit breakers that are capable of detecting both ground faults and arcing faults.

BACKGROUND OF THE INVENTION

Multiple-pole circuit breakers are used when it is necessary or desirable to simultaneously interrupt the flow of electrical current in two or more power conductors. One example is the two-pole circuit breaker that is widely used to comply with requirements that all ungrounded conductors in a multi-wire branch circuit be opened simultaneously. In a 120/240V power circuit, for example, the two line conductors can be connected either to a single 240V load, such as an electric stove, or to two separate 120V loads, and thus the circuit breaker must be capable of opening both line conductors simultaneously. Two-pole circuit breakers capable of detecting both ground faults and arcing faults have been known for some time, but these breakers have generally required separate current sensors for the two line conductors.

SUMMARY

In accordance with one embodiment, a fault detection system is provided for a power distribution system having at least first and second line conductors carrying AC currents that are out of phase with each other from a source to a load, and a common neutral conductor. The system includes an arcing fault current sensor comprising a coil wound on a hollow core and adapted to be coupled to both of the line conductors in a manner that the electrical currents in the line conductors flow in opposite directions inside the hollow core and thus inducing in the coil a first output signal that is a function of the difference of the electrical currents in the line conductors. A neutral current sensor produces a second output signal representing the magnitude and phase direction of current in the neutral conductor. An arcing fault detection circuit receives the first output signal and includes a processor receiving the first and second output signals and programmed to (1) respond to a change in the first output signal to analyze the second output signal to determine whether the change in the first output signal is attributable at least in part to current in a line-to-line circuit, (2) if the answer is affirmative, determine a scaling factor to be used to adjust the value of the first output signal, and (3) analyze the adjusted first output signal to determine whether an arcing fault has occurred and produce a trip signal in response to the detection of an arcing fault.

The system may also include a ground fault current sensor and detection circuit. The ground fault detection circuit receives the output signal from the ground fault current sensor and produces a trip signal in response to the detection of a ground fault. A line-to-ground fault produces a voltage on the ground-fault sensor, but a line-to-line fault or a line-to-neutral fault does not.

One specific application is in a two-pole circuit breaker for use in a three-wire, single-phase, 120V-to-neutral, 240V-line-to-line, AC power distribution system, in which the currents in the two 120-volt lines are 180° out of phase with each other. The fault detection system senses the presence of an arcing current in one or both circuits or poles of a two-pole circuit breaker containing the neutral conductor, and extinguishes the arc by disconnecting both 120-volt lines, which are also the 240-volt lines.

A parallel arcing fault occurring from line-to-neutral is sensed as large current fluctuations (generally greater than three times the circuit's continuous current rating). An algorithm determines that an arc is in a line-to-neutral circuit by the presence of equal fluctuations in the output signals from both the arcing fault current sensor and the neutral current sensor. The absence of current fluctuations in the output signal of the neutral current sensor indicates any arc is occurring line-to-line, and an algorithm applies an appropriate scaling factor to the signal from the arcing fault current sensor.

According to another aspect of the present disclosure, a computer program product is disclosed. The computer product includes one or more non-transitory tangible media having a computer readable program logic embodied therein. The computer readable program logic is configured to be executed to implement a method for detecting faults in a power distribution system having at least first and second line conductors carrying AC currents that are out of phase with each other from a source to a load, and a common neutral conductor. The method includes producing a first signal that is a function of the difference of the electrical currents in the first and second line conductors, and producing a second signal representing the magnitude and phase direction of current in said neutral conductor. The method further includes analyzing the second signal, in response to a change in the first signal, to determine whether the change in the first signal is attributable at least in part to current in a line-to-line circuit and, if the answer is affirmative, determining a scaling factor to be used to adjust the value of the first signal, and then analyzing the adjusted first signal to determine whether an arcing fault has occurred.

According to another aspect of the present disclosure, a method is disclosed for detecting faults in a power distribution system having at least first and second line conductors carrying AC currents that are out of phase with each other from a source to a load, and a common neutral conductor. The method includes producing a first signal that is a function of the difference of the electrical currents in the first and second line conductors, and producing a second signal representing the magnitude and phase direction of current in said neutral conductor. The method further includes analyzing the second signal, in response to a change in the first signal, to determine whether the change in the first signal is attributable at least in part to current in a line-to-line circuit and, if the answer is affirmative, determining a scaling factor to be used to adjust the value of the first signal, and then analyzing the adjusted first signal to determine whether an arcing fault has occurred.

The foregoing and additional aspects of the present invention will be apparent to those of ordinary skill in the art in view of the detailed description of various embodiments, which is made with reference to the drawings, a brief description of which is provided next.

BRIEF DESCRIPTION OF THE DRAWINGS

The invention will be better understood from the following description of preferred embodiments together with reference to the accompanying drawings, in which.

DETAILED DESCRIPTION

Although the invention will be described in connection with certain preferred embodiments, it will be understood that the invention is not limited to those particular embodiments. On the contrary, the invention is intended to cover all alternatives, modifications, and equivalent arrangements as may be included within the spirit and scope of the invention as defined by the appended claims.

Figure 1:
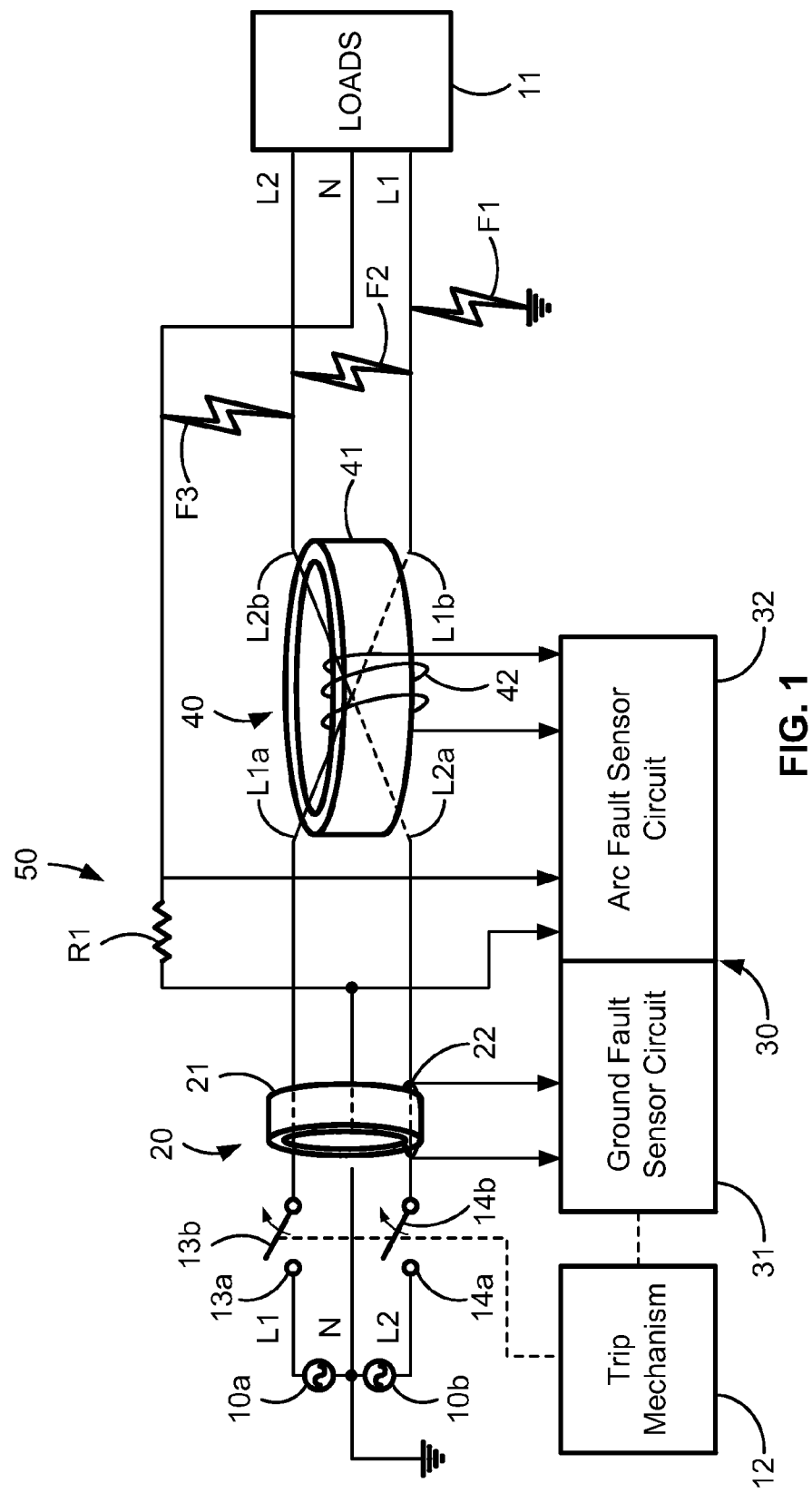
FIG. 1 is a schematic diagram of a three-wire, single-phase, 120V-to-neutral, 240V-line-to-line, AC power distribution system equipped with a dual-pole circuit breaker.

In FIG. 1, a pair of 120-volt power sources 10a and 10b are connected to one or more electrical loads 11 via three lines L1, L2 and N. The power sources 10a and 10b are typically provided by a center-tapped secondary winding of a step-down transformer having a primary winding that receives an input voltage from a utility transmission line. The center tap of the secondary winding is connected to the grounded neutral line N, and opposite ends of the secondary winding are connected to the lines L1 and L2. This arrangement forms a first 120-volt supply across lines L1 and N, a second 120-volt supply across lines L2 and N, and a 240-volt supply across lines L1 and L2. Each of the three supplies is single-phase, and the two 120-volt supplies are 180° out of phase with each other. These are the three power supplies typically provided to residential and small commercial users of electrical power in the United States.

A trip mechanism 12 of a circuit breaker is coupled to the lines L1, L2 and N between the sources 10a, 10b and the load(s) 11, for opening two pairs of contacts 13a, 13b and 14a, 14b when various types of faults are detected in the power circuit. Examples of such faults are ground faults such as the fault F1 from line L2 to ground, parallel arcing faults such as the fault F2 between L1 and L2, and the fault F3 between line L2 and neutral, and series arcing faults that can be caused by a loose connection, a broken conductor or worn insulation in any of the lines.

To detect ground faults in the illustrative system, a ground fault current sensor 20 is coupled to all three of the lines L1, L2 and N. All three conductors L1, L2 and N pass through a toroidal core 21 to form single-turn primary windings on that core. The electrical currents $I_{L1}$, $I_{L2}$ and $I_N$ in the three conductors L1, L2 and N, respectively, induce current flow $I_{gf}$ in a secondary winding 22. The magnitude of the induced current is:

$$I_{gf} = I_{L1} + I_{L2} + I_N$$

When a ground fault occurs, the net current flow $I_{gf}$ induced in the secondary winding 22 increases to a level that can be detected by a controller 30, as is well known in this art. In the absence of a ground fault, the net current flow $I_{gf}$ induced in the secondary winding 22 is at or near zero. The ground fault sensor 20 senses any current that is not returned through one of the three wires. It is typically a copper winding around a magnetizable core with high permeability greater than about 5000 and a window large enough to pass the two phase wires L1 and L2 and the one neutral wire N, similar to the ground fault sensor described in Brown U.S. Pat. No. 7,079,365, which is assigned to the assignee of the present invention. The ground fault signal normally causes an instantaneous trip.

As indicated in FIG. 1, the controller 30 includes both a ground fault detection circuit 31 and an arcing fault detection circuit 32. These two circuits 31 and 32 preferably share a common processor for analyzing their respective input signals to detect the occurrence of faults.

When a fault condition is detected by either of the detection circuits 31 and 32, the controller 30 produces a trip signal that actuates the trip mechanism 12 mechanically coupled to the movable contact in each of the two pairs of contacts 13a, 13b and 14a, 14b, to simultaneously open both lines L1 and L2. The trip mechanism typically includes a solenoid having a movable armature coupled to one or both of the movable contacts, which may be mechanically coupled to each other when the solenoid armature is coupled to only one of the movable contacts. As is conventional in circuit breakers, the movable contacts can also be manually opened, and typically can be closed only by manual operation.

The ground fault detection circuit 31 may be a conventional circuit for generating a trip signal in response to the detection of a ground fault. One example of such a ground fault detection circuit is described in U.S. Pat. No. 7,193,827, which is assigned to the assignee of the present invention. The detection circuit described in that patent detects both ground faults and grounded neutrals with only a single current sensor. The typical thermal-magnetic current sensing components such as a bimetal overload and an instantaneous magnetic latch may also be present.

To detect arcing faults in the illustrative system, the two lines L1 and L2 are coupled to a shared arcing fault current sensor 40 which includes a core 41 consisting of a magnetic material of low permeability to form a di/dt sensor. The segments of the lines L1 and L2 that pass through the core 41 enter and exit the interior of the core on opposite sides so that the currents flowing in the two conductors L1 and L2 have the same effect on a secondary winding 42 wound on the core 41. Specifically, as illustrated in FIG. 1, the source end L1a of the segment of the conductor L1 passing through the core 41 is at the top of the core 41, and the load end L1b of that segment of the conductor L1 is at the bottom of the core 41. For the conductor L2, the source end L2a of the segment of the conductor L2 passing through the core 41 is at the bottom of the core 41, and the load end L2b of that segment of the conductor L1 is at the top of the core 41.

The electrical currents in the two line conductors L1 and L2 are 180° out of phase with each other. However, because the out-of-phase currents in the segments of the two lines L1 and L2 within the core 41 flow in opposite directions, they both induce current flow in the same direction in the secondary winding 42. Thus, when a line-to-line arcing fault occurs, the amplitude of the signal induced in the secondary winding 42 is increased by the additive effect of the two line currents within the core 41. The core 41 preferably has a low level of magnetic permeability, so that the signals induced in the secondary winding 42 are di/dt signals, and the final output signal from the secondary winding 42 is the difference of the two di/dt signals induced in that winding by the currents flowing in the segments of the two line conductors L1 and L2 passing through the core 41. A line-to-line arc will generate twice the signal as a line-to-neutral arc. A series arc in a line-to-line load circuit will generate twice the signal as a series arc in a line-to-neutral load circuit.

The shared arcing fault di/dt sensor core 41 has a sufficient number of winding turns to allow the sensor and associated filter components to produce a suitable output signal over the specified current range of the breaker. For example, the usable current range in which arcs can be detected may be approximately 3 to 1000 amperes. (Ground faults may be detected as low as 5 milliamperes.) The sensor 40 senses fluctuations in two phases of current and is not magnetically saturated over the current range up to the trip level of the instantaneous magnetic trip component (e.g., up to 15 times the circuit's continuous current rating, which is the current that a circuit breaker is designed to carry continuously without overheating or mechanical overstress). The sensor 40 is generally a copper winding around a magnetizable core with low permeability of less than about 300 mu (air=1), and a window large enough to pass the two phase wires. The output signal is a time derivative signal equivalent to the di/dt of the two phases passing through the window. This output signal can be time integrated to $I_{saf}$, the actual current value.

In one example, the arcing fault sensor 40 is a toroid-type sensor having a magnetic permeability in the range of 10 to 100 mu, with 200 to 1000 turns in the winding 42. Alternative structures for the sensor include multi-part cores and coils that form a single sensor when assembled, and also Hall-effect or similar Giant Magnetic Resistive ("GMR") sensors. An additional configuration for a three-pole arc fault breaker may use two di/dt current sensors instead of the normally anticipated three sensors.

When an arcing fault occurs, the resulting high frequency components of the current flow induced in the secondary winding 42 enable the arc fault sensing circuit 32 to detect the occurrence of the arcing fault, as is well known in this art. The arcing fault detection circuit includes a processor programmed to analyze the second output signal, from the coil 42, and produce a trip signal in response to the detection of an arcing fault. One example of such an arcing fault detection circuit is described in U.S. Pat. No. 7,345,860, which is assigned to the assignee of the present invention.

To detect whether an arc fault signal is from one or both turns or phases through the di/dt sensor 40, a neutral current sensor 50 uses the inherent impedance of the neutral wire, represented by the resistor R1 in FIG. 1. The neutral current sensor consists of a low-resistance (e.g., 0.0005 ohm) shunt conductor that produces a low voltage (e.g., 10 millivolts) at 20 amps of neutral current and can carry full short circuit current without destruction when necessary. Alternatively, neutral current sensor may be an inductance that gives an indication of the magnitude of neutral current. The primary purpose of the neutral current sensor is to indicate the level and phase direction of current in the neutral line N. This enables the algorithms for arc detection to determine whether an arcing fault signal is likely due to a line-to-neutral fault or a line-to-line fault, using the following equations:

$$I_{L1}=\frac{1}{2}(I_{saf}-I_N)$$

$$I_{L2}=-\frac{1}{2}(I_{saf}+I_N)$$

It is important to determine whether a change in the output signal from the shared arcing fault sensor 40 is attributable to a change in the current in a line-to-line load or in a line-to-neutral load, so that the output signal from the sensor 40 can be properly scaled to accurately represent the actual magnitude of the current in the circuit in which the change occurred. The signal from the neutral current sensor 50 makes this determination possible, because the current flowing in the neutral conductor ($I_N=-I_{L1}-I_{L2}$) will be zero when the current change detected by the sensor 40 is caused solely by a change in the current in a line-to-line circuit, and will be equal to the current detected by the sensor 40 when the current change detected by the sensor 40 is caused solely by a change in the current in a single-line-to-neutral circuit. Thus the magnitude of the signal from the neutral current sensor 50 can be used to determine what scaling factor (SF) should be applied to the value represented by the output signal from the sensor 40 before that value is used in an algorithm to determine whether an arcing fault has occurred.

When the current in the neutral conductor is zero, a scaling factor SF of 0.5 is selected, and when the current in the neutral conductor is equal to that detected by the arcing fault current sensor 40, a scaling factor SF of 1.0 is selected (i.e., no scaling). When the output signal from the neutral current sensor 50 represents a neutral current magnitude between zero and that of the current detected by the arcing fault sensor 40, a scaling factor SF between 0.5 and 1.0 is selected. When the neutral current or its fluctuations have a low magnitude compared to those of the line currents, any arcing is likely due to line-to-line currents, and thus a scaling factor of 0.5 is applied to the output signal from the shared arcing fault sensor 40, i.e., $SF=0.5(1+I_N/I_{saf})$. When the neutral current has a higher magnitude, similar to that of the phase currents, then the arcing is likely due to a single phase wire (i.e., line L1 or L2), and thus the output signal from the shared arcing fault sensor 40 remains scaled to 1.0. For probable series arcing faults, the scaling factor remains at 1.0 for all signals, provided the sum of $I_N$ and $I_{saf}$ is less than 6 times the rated current.

A parallel arcing fault is an arc occurring line-to-line or line-to-neutral and is likely to be at least three times the rated current, which will be referred to as "a 3× current." A 3× arcing fault current is sensed by the di/dt sensor as a 3× current if occurring line-to-neutral, or as a 6× current if occurring line-to-line.

Figure 2:
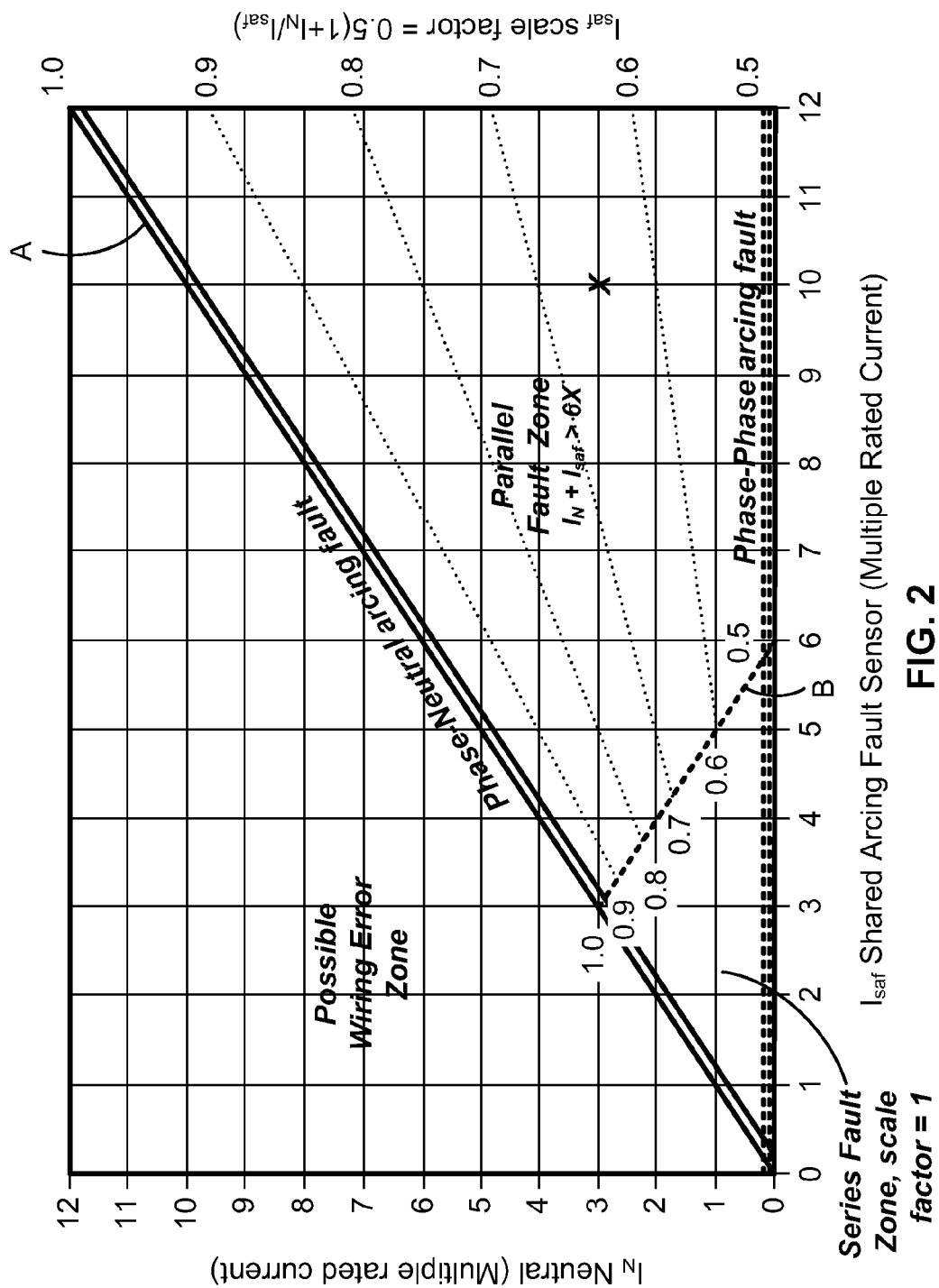
FIG. 2 is a graph of the outputs of the arcing fault current sensor and the neutral current sensor plotted against each other, with both signals represented as multiples of the rated current.

The arcing fault algorithms used to determine whether an arcing fault has occurred typically require an estimate of the line current as well as the power factor of the loads. The nature of the shared arc fault sensor 40 is that a current passing through a load connected line-to-line will produce twice the signal in the shared arcing-fault sensor as a current passing through a line-to-neutral load. In the event that the load is a mix of line-to-neutral and line-to-line loads, the fraction of current associated with a possible arcing event may be estimated. FIG. 2 shows the scale factors of 0.5 to 1.0 that may be multiplied by the output signal of the shared arcing fault sensor 40 to correct the line-to-line currents that are detected by that sensor. This scale factor is applied to current signals representing at least 3× rated phase current.

When the neutral current is zero, the arcing signal is known to be due entirely to line-to-line arcing or a series arc with line-to-line loads. The resulting arcing signal is thus scaled by 0.5 to account for the 2× signal multiplier of the two turns through the sensor.

When the magnitude of the neutral current is equal to the time integrated shared arcing fault sensor output signal, the arcing signal is known to be due entirely to a single line-to-neutral arc or load, and thus a scaling factor of 1.0 is applied to the sensor output signal.

When the magnitude of the neutral current magnitude is between zero and the magnitude of the time integrated output signal from the shared arcing fault sensor, the arcing signal is assigned to the worse case (larger) of the two possible phase currents, and an algorithm calculates an arc probability based on the scale factor of FIG. 2.

FIG. 2 is a graph of $I_{saf}$ plotted against $I_N$, with both signals represented as multiples of the rated current. The scale on the right-hand vertical axis and line B in FIG. 2 are the SF values required to satisfy the equation $SF=0.5(1+I_N/I_{saf})$. As depicted in FIG. 2, the scaling factors SF are applied only to $I_{saf}$ values that fall within the "parallel fault zone," which is the region below the line A and between line B and the right-hand vertical axis. Line A represents $I_N=I_{saf}$, and line B represents $(I_N+I_{saf})=6$.

The region above the line A is designated the "possible wiring error zone" because the current sensed by the neutral current sensor 20 has a higher multiple of the rated current than the current sensed by the arcing fault sensor 40, which indicates that an arcing fault does not exist but that a wiring error might exist.

The region below the line A and to the left of the line B is designated the "series fault zone" because the sum of the multiples of the currents sensed by the neutral current sensor 20 and the arcing fault current sensor 40 is less than 6 ($I_N + I_{saf} < 6$), which indicates that any arcing fault that exists is likely a series arcing fault, not a parallel arcing fault. Thus, a scaling factor of 1.0 is used for all $I_{saf}$ values falling within this region. The two effective turns in the shared arcing fault current sensor 40 automatically produce the same level of signal for a typical series arc occurring in a line-to-neutral load or in a line-to-line load.

A series arc has the property of imposing voltage fluctuations in series with the total voltage drop across the load. The resulting current fluctuations of a series arc current in a load circuit connected line-to-neutral are twice as large as those in a line-to-line circuit. A small 1-volt change in the series arc causes twice the current change, or di/dt, in a line-to-neutral 120-volt circuit as in a similar line-to-line 240-volt load current.

An arcing event occurring in a series connection is sensed through one turn of the di/dt sensor during a line-to-neutral arc, but through both turns of the sensor during a line-to-line arc. The effect of the turns is to multiply the series arc signal by two in a line-to-line circuit. This means a 1-volt fluctuation in a series arc will create the same signal in the di/dt sensor regardless of whether the circuit contains a line-to-line load or a line-to-neutral load.

Within the "parallel fault zone," the combined values of $I_N$ and $I_{saf}$ indicate a potential arcing fault, and thus the SF values in this zone are used to adjust the time integrated value of $I_{saf}$ before it is used in the algorithms utilized to determine whether an arcing fault has occurred. In general, an output signal from the sensor 40 that is at least 3 times the rated current will be considered an arcing fault, if the "signature" of that current otherwise satisfies the criteria for an arcing fault. However, when the current detected by the sensor 40 is passing through a line-to-line load, the output signal from the sensor 40 will have a magnitude twice that produced by a current passing through a line-to-neutral load. This is because the current change produced by an arcing fault appears in both lines L1 and L2 with a line-to-line load, but in only one of the lines (L1 or L2) with a line-to-neutral load.

For example, if the arcing fault sensor 40 produces a signal that, when time integrated, represents a current $I_{saf}$ of 200 A and the neutral current sensor produces a signal representing a current $I_N$ of 60 A, and the circuit breaker is rated at 20 A, then $I_{saf}$ is a multiple of 10 times the rated current, and $I_N$ is a multiple of 3 times the rated current. As can be seen from FIG. 2, the scaling factor SF for the present example is 0.65 (identified by an "x" in FIG. 2), and thus the 200 A value of $I_{saf}$ is multiplied by 0.65 before being used in the algorithms used to determine whether an arcing fault has occurred. In other words, the value $I_{saf}$ used by those algorithms is 130 A rather than 200 A.

When the output signal from the neutral current sensor 50 represents a neutral current magnitude between zero and the current detected by the arcing fault sensor 40, the direction of the change in the outputs of the two sensors 40 and 50 can be used to associate detected parallel arcing with one of the two lines L1 or L2. Specifically, an increase in the neutral-current signal from the neutral current sensor 50 will be associated with line L1 if the output signal from the arcing-fault sensor 40 decreases, and with line L2 if the output signal from the arcing-fault sensor 40 increases. Similarly, a decrease in the neutral-current signal from the neutral current sensor 50 will be associated with line L1 if the output signal from the arcing-fault sensor 40 increases, and with line L2 if the output signal from the arcing-fault sensor 40 decreases.

As a further refinement, the signal from the neutral current sensor 50 can be used to determine whether an arcing fault is in a 120-volt circuit or a 240-volt circuit, so that different algorithms can be utilized. For example, if the arcing fault in a 240-volt circuit, the algorithm utilized may trip the circuit breaker more quickly than the algorithm utilized for an arcing fault in a 120-volt circuit. (Existing standards, such as UL 1699, specify faster trips for higher levels of arcing fault currents.) If the signal from the neutral current sensor 50 indicates possible arcing and is fluctuating in phase with the signal from the arcing fault sensor 40, then the arcing fault is in a 120-volt circuit. The 120-volt-circuit algorithm is used to analyze whichever line current is indicated by the polarity of the current represented by the output signal from the neutral current sensor, and no scaling factor is applied to the output signal from the arcing fault sensor 40. If the signal from the neutral current sensor 50 indicates current flow in the neutral conductor but is not fluctuating, then the arcing fault is in a 240-volt circuit. The 240-volt-circuit algorithm is used to analyze the output signal from the arcing fault sensor 40, using a scaling factor of 0.5.

Figure 3:
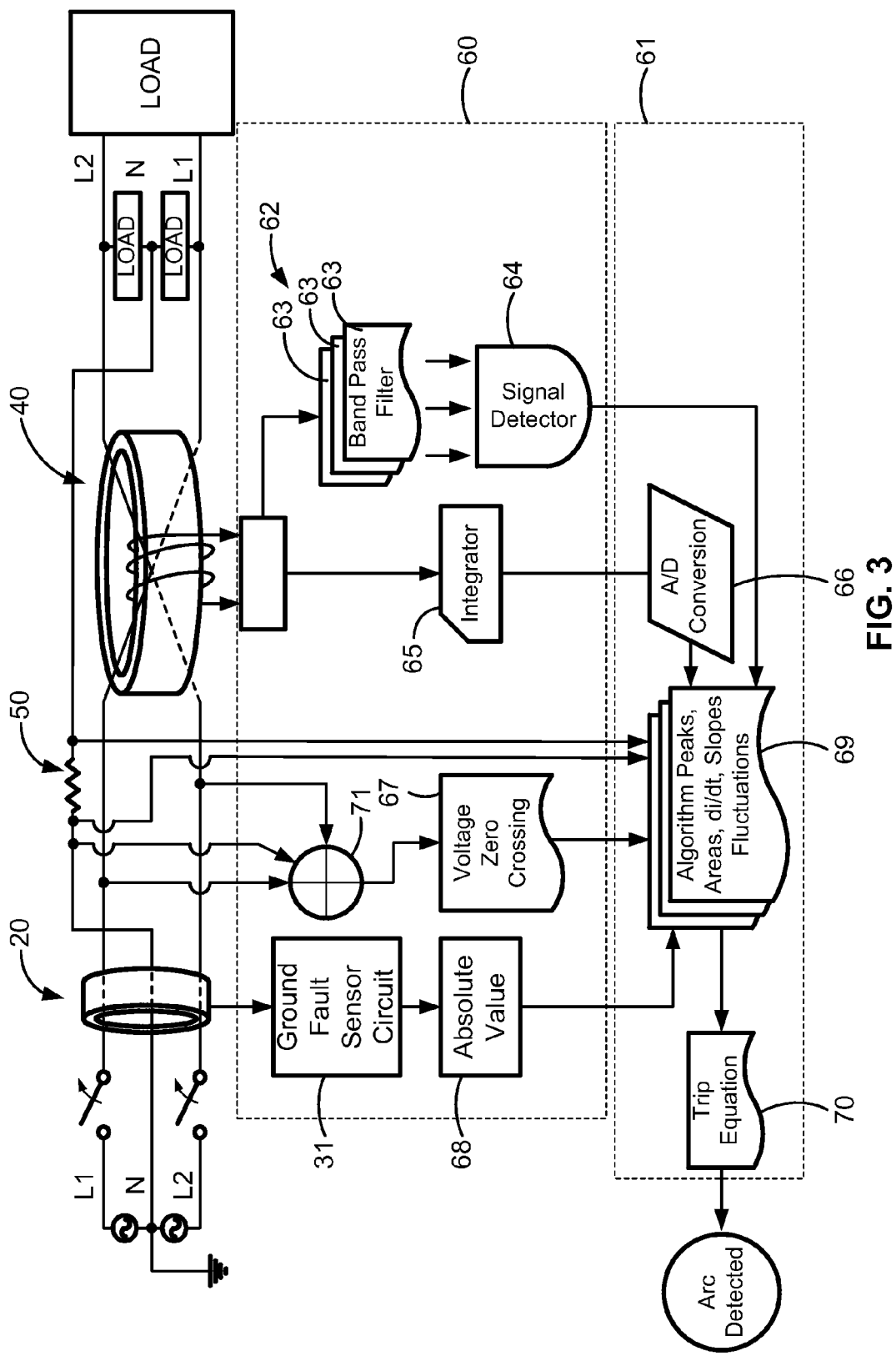
FIG. 3 is a more detailed functional block diagram of a fault detection system utilizing the sensor arrangement of FIG. 1.

FIG. 3 is a more detailed functional block diagram of a fault detection system utilizing the sensor arrangement of FIG. 1. In one embodiment, the components of the ground fault sensor circuit 31 and the arcing fault sensor circuit 32 arcing fault circuit detector are provided on an application specific integrated circuit (ASIC) 60. Suitable output signals from the ASIC 60 are fed to a microcontroller or microprocessor 61 that, based on analysis and further processing of the signals provided by the ASIC 60, makes a decision as to whether to send a trip signal. This trip signal is used for activating the trip mechanism 12.

A broadband noise detector 62 comprises one or more band-pass filter circuits 63 that receive the rate of change of current signal from the di/dt sensor 40. The bands passed by these circuits 63 are selected to enable the detection of the presence of broadband noise in frequency bands which are representative of a frequency spectrum typical of arcing faults. Each of the band-pass filter circuits 63 feeds a filtered signal, comprising those components of an input signal from the di/dt sensor which fall within their respective band-pass frequency bands, to a signal detector circuit 64.

The output of the sensor 40 may also feed a time-integration or integrator circuit 65. The integrator may be a passive resistor-capacitor circuit followed by an amplified integrator, the output of which is proportional to the AC current. The integrator 65 provides a signal to be sampled by an analog-to-digital A/D converter 66. In one embodiment, the output of the A/D converter 66 is a series of 8-bit (minimum) values representing the current at a rate of 32 samples per half cycle. The A/D converter may be a part of the microcontroller 61. As the frequency drifts from nominal, the time between voltage zero crossings, detected at a zero crossing detection circuit 67, is measured using internal timers and used to vary the sample rate to achieve a constant number of samples per cycle. The zero crossing detection circuit 67 receives voltage signals from a voltage sensor 71.

The broadband noise detector 62 determines if there is simultaneously a trigger level signal in two or more frequency bands. In order to do this, a portion of the signal from the di/dt sensor 40 is routed to the band-pass filters 63. The minimum number of band-pass filters is two. The frequency bands of the filters are chosen across the spectrum from 10 kHz to 100 kHz. In one example, for a two-band implementation, the center frequencies are 33 kHz and 58 kHz. In this example, the output signals from the band-pass filters 63 are detected (rectified) and filtered with a low pass filter having a corner frequency of 5 kHz. The signal output of each frequency band is routed to a comparator (signal detector) 64, where it is compared with a reference voltage level, and, if sufficient, causes an output pulse. The "trigger level" of the signal from each band required to produce an output pulse from the comparator is determined by analyzing the non-arcing load-generated signature of the application. Additional comparators (AND gates) are used to send a pulse whenever multiple filter bands simultaneously receive a triggering signal in their band. The resulting pulses indicating signal acquisition in multiple bands are counted by the microcontroller 61 and used in some arc detection algorithms.

The use of the terms "band-pass filter," "comparator," "AND gate," and "integrator" does not limit the invention to hardware equivalents of these devices. Software equivalents of these functions can be implemented, provided the di/dt signal (from sensor 40) is first amplified and converted to digital values.

In the illustrative embodiment, the voltage sensor 71 may be implemented as a resistor divider (not shown) which provides an attenuated voltage level compatible with the solid state logic devices. The zero crossing circuit 67 may be implemented with a low pass filter (corner frequency 1 kHz) and comparators to provide a digital "1" when the voltage is above zero volts and a digital "0" when the voltage is below zero volts. The microcontroller 61 accepts the logic levels and incorporates timers to determine if the system frequency has increased or decreased from the previous cycle. The A/D sample rate is then adjusted faster or slower to maintain 64±1 samples per cycle.

The ground fault sensor circuit 31 feeds an absolute value circuit 68 that turns negative-going signals into positive signals and passes positive-going signals through unchanged. The positive signals are then supplied to the microcontroller 61.

FIG. 3 illustrates one embodiment of an ASIC 60 for performing the above-described operations. Further details of an ASIC 60 and equivalent circuits which may be utilized may be found in U.S. Pat. No. 6,246,556, assigned to the assignee of the present invention. Details regarding an algorithm used to analyze the current waveforms and broadband noise to determine whether arcing is present may be found in U.S. Pat. No. 6,259,996, assigned to the assignee of the present invention.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A fault detection system for a power distribution system having at least first and second line conductors carrying AC currents that are out of phase with each other from a source to a load, and a common neutral conductor, comprising an arcing fault current sensor comprising a coil wound on a hollow core and adapted to be coupled to both of said line conductors in a manner that the electrical currents in said line conductors flow in opposite directions inside said hollow core and thus inducing in said coil a first output signal that is a function of the difference of the electrical currents in said line conductors, a neutral current sensor producing a second output signal representing the magnitude and phase direction of current in said neutral conductor, an arcing fault detection circuit receiving said first output signal and including a processor receiving said first and second output signals and programmed to respond to a change in said first output signal to analyze said second output signal to determine whether said change in said first output signal is attributable at least in part to current in a line-to-line circuit and, if the answer is affirmative, determining a scaling factor to be used to adjust the value of said first output signal, and analyze said adjusted first output signal to determine whether an arcing fault has occurred.

2. The fault detection system of claim 1 in which said power distribution system has a rated current, said processor is programmed to compare the currents represented by said first and second output signals with said rated current, and to analyze said second output signal only when said current represented by said first output signal exceeds said rated current by a multiple of said rated current that is at least as great as the multiple by which said current represented by said second output signal exceeds said rated current.

3. The fault detection system of claim 1 in which said power distribution system has a rated current, said processor is programmed to compare the currents represented by said first and second output signals with said rated current, and to analyze said second output signal only when said currents represented by said first and second output signals exceed said rated current by a predetermined amount.

4. The fault detection system of claim 1 in which said processor is programmed to determine a scaling factor that is one half of the sum of one plus the ratio of said second output signal to said first output signal.

5. The fault detection system of claim 1 in which said processor is programmed to determine whether said change in said first output signal is attributable solely to a change in the current in a line-to-line circuit and, if the answer is affirmative, to reduce the value of said first output signal by 50%.

6. The fault detection system of claim 1 in which said processor is programmed to determine whether said change in said first output signal is attributable solely to a change in the current in a line-to-neutral circuit and, if the answer is affirmative, to analyze said first output signal, without any adjustment, to determine whether an arcing fault has occurred.

7. The fault detection system of claim 1 in which said power distribution system includes at least one 120-volt circuit and at least one 240-volt circuit, and said processor is programmed to analyze said first and second output signals to determine whether a change in said first output signal is attributable to a change in the current in said 120-volt circuit or in said 240-volt circuit.

8. The fault detection system of claim 1 in which said processor is programmed to use the magnitude of said second output signal to determine whether a detected arcing fault is line-to-neutral arcing fault or a line-to-line arcing fault, based on said second output signal having a greater magnitude when a line-to-neutral arcing fault occurs than when a line-to-line arcing fault occurs.

9. The fault detection system of claim 1 in which said power distribution system has a rated current, said processor is programmed to compare the currents represented by said first and second output signals with said rated current, and to determine that a potential wiring error exists when said current represented by said second output signal exceeds said rated current by a multiple of said rated current that is greater than the multiple by which said current represented by said first output signal exceeds said rated current.

10. The fault detection system of claim 1 in which said power distribution system has a rated current, said processor is programmed to compare the currents represented by said first and second output signals with said rated current, and to determine that a series arcing fault exists when said currents represented by said first and second output signals exceed said rated current by less than a predetermined amount.

11. A method of detecting faults in a power distribution system having at least first and second line conductors carrying AC currents that are out of phase with each other from a source to a load, and a common neutral conductor, comprising
producing a first signal that is a function of the difference of the electrical currents in said first and second line conductors,
producing a second signal representing the magnitude and phase direction of current in said neutral conductor,
in response to a change in said first signal, analyzing said second signal to determine whether said change in said first signal is attributable at least in part to current in a line-to-line circuit and, if the answer is affirmative, determining a scaling factor to be used to adjust the value of said first signal, and
analyzing said adjusted first signal to determine whether an arcing fault has occurred.

12. The method of claim 11 in which said power distribution system has a rated current, and said method includes comparing the currents represented by said first and second signals with said rated current, and analyzing said second signal only when said current represented by said second signal exceeds said rated current by a multiple of said rated current that is at least as great as the multiple by which said current represented by said first signal exceeds said rated current.

13. The method of claim 11 in which said power distribution system has a rated current, said method includes comparing the currents represented by said first and second signals with said rated current, and analyzing said second signal only when said currents represented by said first and second signals exceed said rated current by a predetermined amount.

14. The method of claim 11 which includes determining a scaling factor that is one half of the sum of one plus the ratio of said second signal to said first signal.

15. The method of claim 11 which includes determining whether said change in said first signal is attributable solely to a change in the current in a line-to-line circuit and, if the answer is affirmative, reducing the value of said first signal by 50%.

16. The method of claim 11 which includes determining whether said change in said first signal is attributable solely to a change in the current in a line-to-neutral circuit and, if the answer is affirmative, analyzing said first signal, without any adjustment, to determine whether an arcing fault has occurred.

17. The method of claim 11 in which said power distribution system includes at least one 120-volt circuit and at least one 240-volt circuit, and said method includes analyzing said first and second signals to determine whether a change is said first signal is attributable to a change in the current in said 120-volt circuit or in said 240-volt circuit.

18. The method of claim 11 which includes using the magnitude of said second signal to determine whether a detected arcing fault is line-to-neutral arcing fault or a line-to-line arcing fault, based on said second signal having a greater magnitude when a line-to-neutral arcing fault occurs than when a line-to-line arcing fault occurs.

19. A computer program product, comprising one or more non-transitory tangible media having a computer readable program logic embodied therein, the computer readable program logic configured to be executed to implement a method for detecting faults in a power distribution system having at least first and second line conductors carrying AC currents that are out of phase with each other from a source to a load, and a common neutral conductor, the method comprising:
producing a first signal that is a function of the difference of the electrical currents in said first and second line conductors,
producing a second signal representing the magnitude and phase direction of current in said neutral conductor,
in response to a change in said first signal, analyzing said second signal to determine whether said change in said first signal is attributable at least in part to current in a line-to-line circuit and, if the answer is affirmative, determining a scaling factor to be used to adjust the value of said first signal, and
analyzing said adjusted first signal to determine whether an arcing fault has occurred.

* * * * *